US007026715B2

(12) United States Patent
Matsunaga et al.

(10) Patent No.: US 7,026,715 B2
(45) Date of Patent: Apr. 11, 2006

(54) SEMICONDUCTOR DEVICE HAVING WIRING LAYER FORMED IN WIRING GROOVE

(75) Inventors: Noriaki Matsunaga, Chigasaki (JP); Kazuyuki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/628,689

(22) Filed: Jul. 28, 2003

(65) Prior Publication Data

US 2004/0135255 A1    Jul. 15, 2004

(30) Foreign Application Priority Data

Jan. 9, 2003    (JP)    ............. 2003-003290

(51) Int. Cl.
  H01L 23/48    (2006.01)
  H01L 23/52    (2006.01)
  H01L 29/40    (2006.01)
(52) U.S. Cl. .................. 257/758; 257/760
(58) Field of Classification Search ............ 257/211, 257/758, 759, 760, 762, 763, 774, 775
See application file for complete search history.

(56) References Cited

U.S. PATENT DOCUMENTS 6,340,435 B1 *  1/2002  Bjorkman et al. ............ 216/72
6,590,290 B1 *  7/2003  Cronin et al. ................ 257/774
6,614,096 B1 *  9/2003  Kojima et al. ............... 257/635
6,753,608 B1 *  6/2004  Tomita ........................ 257/758

OTHER PUBLICATIONS

K. Higashi, et al., "*A Manufacturable Copper/Low-k SiOC/SiCN Process Technology for 90nm-node High Performance eDRAM*," Proceedings of the IEEE 2002 International Interconnect Technology Conference, Jun. 2002, pp. 15-17.

* cited by examiner

*Primary Examiner*—Hoai Pham
(74) *Attorney, Agent, or Firm*—Frommer Lawrence & Haug LLP (57) ABSTRACT

A semiconductor device is disclosed, which comprises a semiconductor substrate, an interlayer insulating film formed on the semiconductor substrate, the interlayer insulating film comprising a first insulating film and a second insulating film formed on the first insulating film, the first insulating film comprising a silicon oxide film containing carbon of a concentration, the second insulating film comprising a silicon oxide film containing carbon of a concentration lower than the concentration of the first insulating film or comprising a silicon oxide film containing substantially no carbon, a via contact made of a metal material embedded in a via hole formed in the interlayer insulating film, a diameter of the via hole in the first insulating film being smaller than that in the second insulating film at an interface between the first insulating film and the second insulating film.

12 Claims, 6 Drawing Sheets

SEMICONDUCTOR DEVICE HAVING WIRING LAYER FORMED IN WIRING GROOVE

CROSS-REFERENCE TO RELATED APPLICATIONS

This application is based upon and claims the benefit of priority from the prior Japanese Patent Application No. 2003-003290, filed Jan. 9, 2003, the entire contents of which are incorporated herein by reference.

BACKGROUND OF THE INVENTION

1. Field of the Invention

The present invention relates to a semiconductor device and a method of manufacturing the same, and more particularly to a sectional shape of metal wiring or via contact in multilayer wiring using an interlayer insulating film containing carbon and a method of forming the same, being used, for example, in a semiconductor integrated circuit having metal wiring or via contact using copper (Cu) or Cu alloy.

2. Description of the Related Art

Recently, in the trend of higher speed of LSI, a film of low dielectric constant comes to be used as interlayer dielectric (ILD) of multilayer wiring. The relative dielectric constant of a conventional $SiO_2$ film is about 4.0, the relative dielectric constant of a $SiO_2$ film containing fluorine is about 3.4 to 3.9, and an insulating film of lower relative dielectric constant of 3 or less is also recently used.

Generally, however, materials of low dielectric constant are weak in mechanical strength. Besides, carbon is often contained in the film in order to lower the dielectric constant. In such a case, the added carbon or $CH_3$ (methyl group) may be damaged to lower the carbon concentration by a dry process such as resist ashing or reactive ion etching (RIE).

To prevent mechanical damage by chemical mechanical polishing (CMP) or damage by dry process, it has been attempted to form an interlayer insulating film by laminating insulating films of different carbon concentrations. The interlayer insulating film of this structure is effective against mechanical or chemical damage from above the film, however, the side surface of the wiring groove or via hole is lower in effectiveness because the film of low dielectric constant is exposed.

Problems of the interlayer insulating film of this structure are summarized below.

Figure 10A:
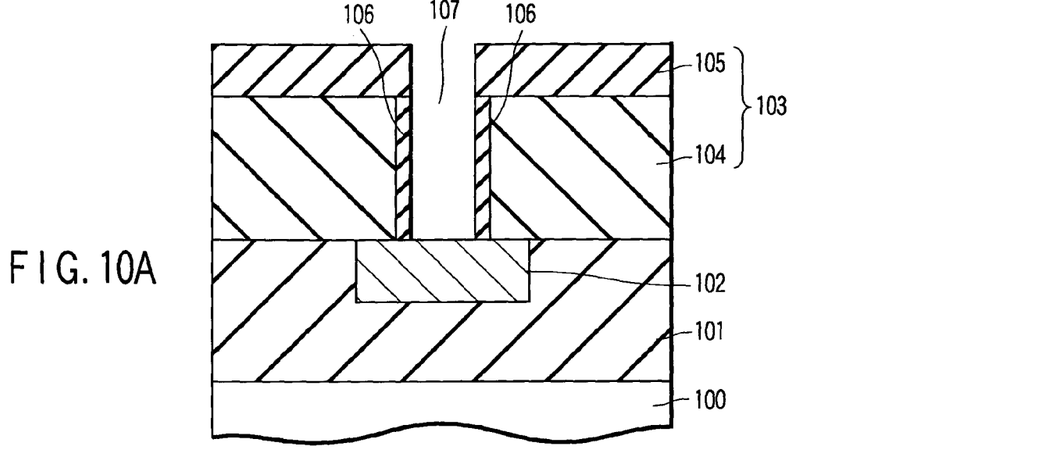
FIG. 10A is a sectional view of a semiconductor device in one step of a conventional method of manufacturing a semiconductor device, particularly in a step of forming via holes (or wiring grooves) in a multilayer wiring section.
Figure 10B:
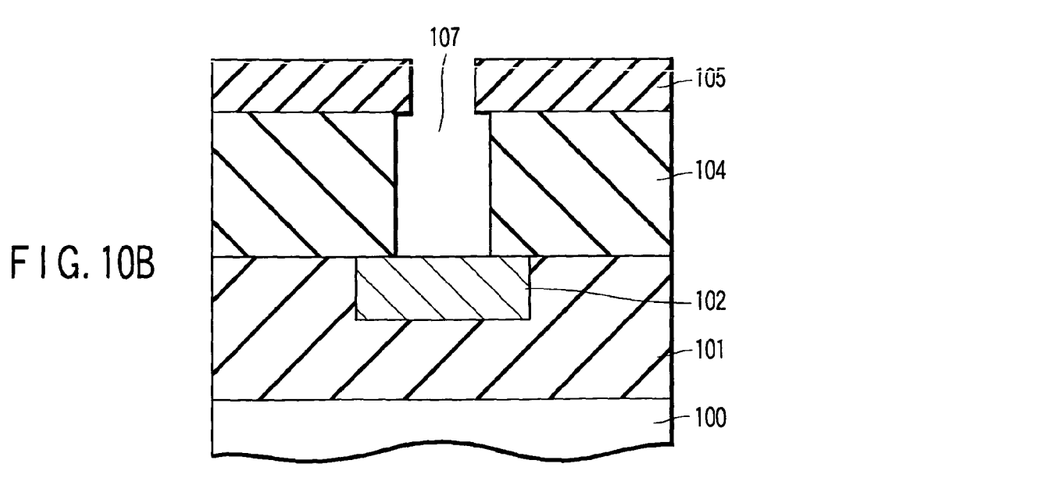
FIG. 10B is a sectional view of a semiconductor device in a further step of the conventional method of manufacturing the semiconductor device, particularly in a step of forming via holes (or wiring grooves) in a multilayer wiring section.

FIGS. 10A and 10B are sectional views of a semiconductor device in steps of a conventional method of manufacturing a semiconductor device, particularly showing the section of the semiconductor device in steps of forming via holes (or wiring grooves) in a multilayer wiring section.

As shown in FIG. 10A, a lower layer wiring 102 is buried in an insulating film 101 on a semiconductor substrate 100, and an interlayer insulating film 103 is deposited on the lower layer wiring 102 and insulating film 101. The interlayer insulating film 103 has a laminated structure composed of a first insulating film 104 formed of a silicon oxide film (hereinafter, referred to as Si oxide film) containing carbon, such as methyl siloxane, SiOCH, or SiOC, and a second insulating film (for example, $SiO_2$, or SiOCH, low in carbon concentration) 105 of low carbon concentration as a cap film laminated on the first insulating film 104.

When via holes (or wiring grooves) 107 are formed in the interlayer insulating film 103 of such structure, on the side surface of the first insulating film 104 defining the via holes, the concentration of the contained carbon is lowered, and a damaged layer 106 of lowered carbon concentration is formed in the manufacturing process such as RIE or resist ashing (peeling off).

Since the damaged layer 106 has a property close to that of $SiO_2$, in a wet etching process, which is described later, using chemical solution such as HF or $NHF_3$, it is likely to be dissolved and lost as shown in FIG. 10B, or contracted in a subsequent heating process. As a result, the opening size of the via holes in the second insulating film 105 is smaller than that in the first insulating film 104, and protruding marks of opening edges of the second insulating film 105 are left over in the openings of the first insulating film 104.

Figure 11A:
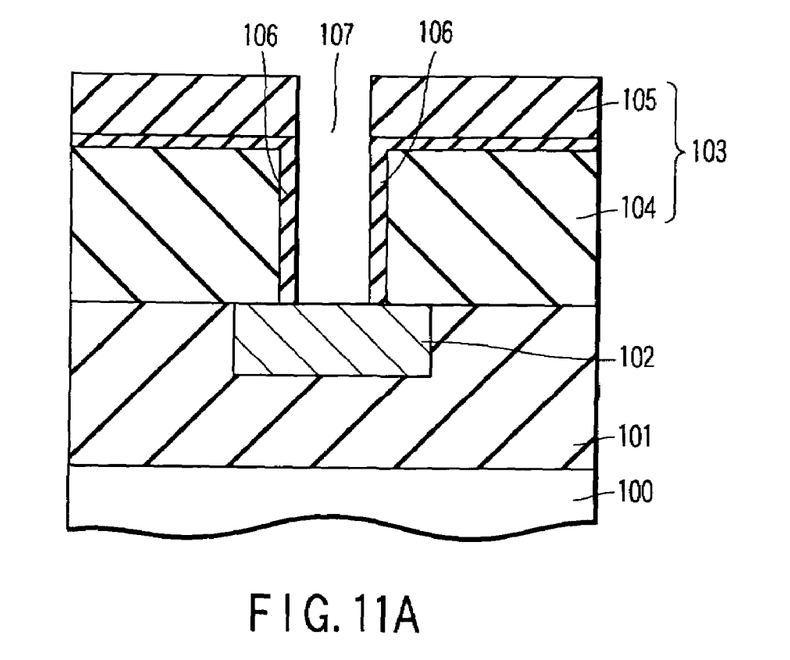
FIG. 11A is a sectional view of a semiconductor device in one step of another conventional method of manufacturing a semiconductor device, particularly in a step of forming via holes (or wiring grooves) in a multilayer wiring section.
Figure 11B:
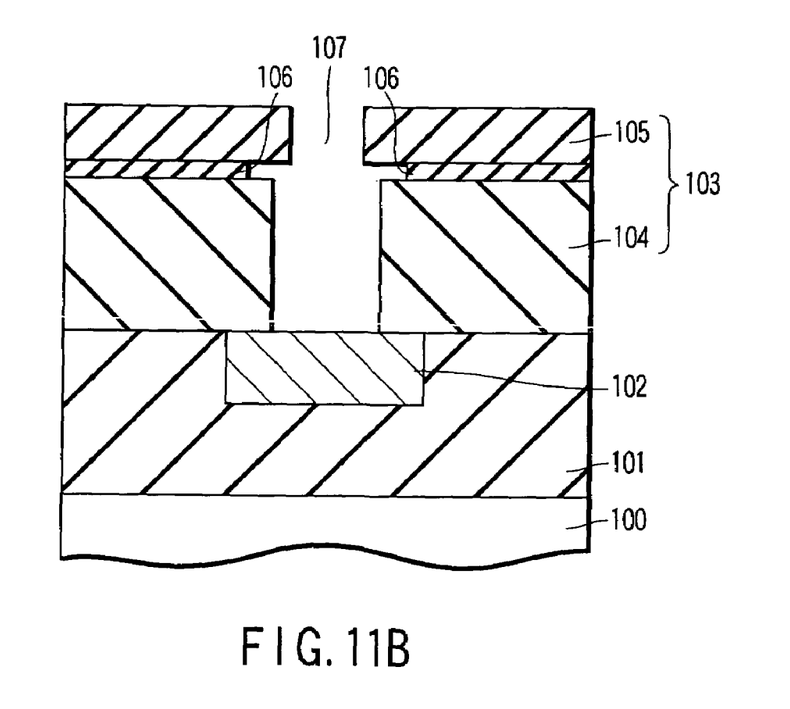
FIG. 11B is a sectional view of a semiconductor device in a further step of the conventional method of manufacturing the semiconductor device, particularly in a step of forming via holes (or wiring grooves) in a multilayer wiring section.

FIGS. 11A and 11B are sectional views of a semiconductor device in steps of another conventional method of manufacturing the semiconductor device, particularly showing the section of the semiconductor device in steps of forming via holes (or wiring grooves) in a multilayer wiring section.

As shown in FIG. 11A, the second insulating film 105 is formed by a plasma process on the first insulating film 104 functioning as a cap film. In this case, a damaged layer 106 is formed on the top of the first insulating film 104. When a via hole (or wiring groove) 107 is formed in the interlayer insulating film 103, the damaged layer 106 is formed on the side surface of the first insulating film 104 for defining the via holes in the manufacturing process such as RIE or resist ashing. The damaged layer 106 are also likely to be dissolved and lost in a wet etching process, which is performed later, using chemical solution such as HF or $NHF_3$ as shown in FIG. 11B. As a result, as in the afore-mentioned example, protruding marks of opening edges of the second insulating film 105 are left over in the openings of the first insulating film 104.

The protruding marks of opening edges of the second insulating film 105 left over in the openings of the first insulating film 104 as shown in FIG. 10B and FIG. 11B may cause to form thin portions or disconnections in a barrier metal film formed when a wiring or via is formed in a subsequent step or an insufficient embedding of metal wiring material (Cu or Cu alloy). These are not preferable from the viewpoint of reliability of wiring. Also, at the time of heat treatment, the metal wiring may break out from the thin portion of the barrier metal film, which may lower the electromigration resistance or stress migration resistance of buried wiring or via portions.

It has been attempted to decrease such protruding marks as much as possible to optimizing the etching process, ashing process, cleaning process, and the like, however, ultimately protrusions are formed more or less. Such phenomenon of protrusion is disclosed by K. Higashi et al. in "A Manufacturable Copper/Low-k SiO/SiCN Process Technology for 90 nm-node High Performance eDRAM," 2002 proceedings of IEEE IITC, pp. 15–17.

As mentioned above, in the conventional multilayer wiring structure of the semiconductor device, when the buried wiring or via contact is formed in the wiring grooves or via holes formed in the interlayer insulating film having a first insulating film composed of a Si oxide film containing carbon and a second insulating film of lower carbon concentration (containing no carbon) formed on the first insulating film, thin portions or disconnections are formed in the barrier metal, or the metal wiring material may be insufficiently embedded.

BRIEF SUMMARY OF THE INVENTION

According to an aspect of the present invention, there is provided a semiconductor device comprising: a semiconductor substrate; an interlayer insulating film formed on the semiconductor substrate, the interlayer insulating film comprising a first insulating film and a second insulating film formed on the first insulating film, the first insulating film comprising a silicon oxide film containing carbon of a concentration, the second insulating film comprising a silicon oxide film containing carbon of a concentration lower than the concentration of the first insulating film or comprising a silicon oxide film containing substantially no carbon, a via contact made of a metal material embedded in a via hole formed in the interlayer insulating film, a diameter of the via hole in the first insulating film being smaller than that in the second insulating film at an interface between the first insulating film and the second insulating film.

According to another aspect of the present invention, there is provided a semiconductor device comprising: a semiconductor substrate; an interlayer insulating film formed on the semiconductor substrate, the interlayer insulating film comprising a first insulating film and a second insulating film formed on the first insulating film, the first insulating film comprising a silicon oxide film containing carbon of a concentration, the second insulating film comprising a silicon oxide film containing carbon of a concentration lower than the concentration of the first insulating film or comprising a silicon oxide film containing substantially no carbon, a metal wiring of a metal material embedded in a wiring groove formed in the interlayer insulating film, a diameter of the wiring groove in the first insulating film being smaller than that in the second insulating film at an interface between the first insulating film and the second insulating film.

According to a further aspect of the present invention, there is provided a method of manufacturing a semiconductor device comprising: forming an interlayer insulating film on a semiconductor substrate, the interlayer insulating film comprising a first insulating film and a second insulating film formed on the first insulating film, the first insulating film comprising a silicon oxide film containing carbon of a concentration, the second insulating film comprising a silicon oxide film containing carbon of a concentration lower than the concentration of the first insulating film or comprising a silicon oxide film containing substantially no carbon, forming a via hole in the interlayer insulating film, removing a damaged layer formed on a side surface of the first insulating film which defines a portion of the via hole, the damaged layer being formed when the via hole is formed, and retreating a side surface of the second insulating film which defines a portion of the via hole, and embedding a metal material in the via hole to form a via contact in the via hole.

According to a further aspect of the present invention, there is provided a method of manufacturing a semiconductor device comprising: forming an interlayer insulating film on a semiconductor substrate, the interlayer insulating film comprising a first insulating film and a second insulating film formed on the first insulating film, the first insulating film comprising a silicon oxide film containing carbon of a concentration, the second insulating film comprising a silicon oxide film containing carbon of a concentration lower than the concentration of the first insulating film or comprising a silicon oxide film containing substantially no carbon, forming a wiring groove in the interlayer insulating film, removing a damaged layer formed on a side surface of the first insulating film which defines a portion of the wiring groove, the damaged layer being formed when the wiring groove is formed, and retreating a side surface of the second insulating film which defines a portion of the wiring groove, and embedding a metal material in the via hole to form a metal wiring in the wiring groove.

DETAILED DESCRIPTION OF THE INVENTION

Embodiments of the invention are described specifically below referring to the accompanying drawings.

<First Embodiment>

Figure 1A:
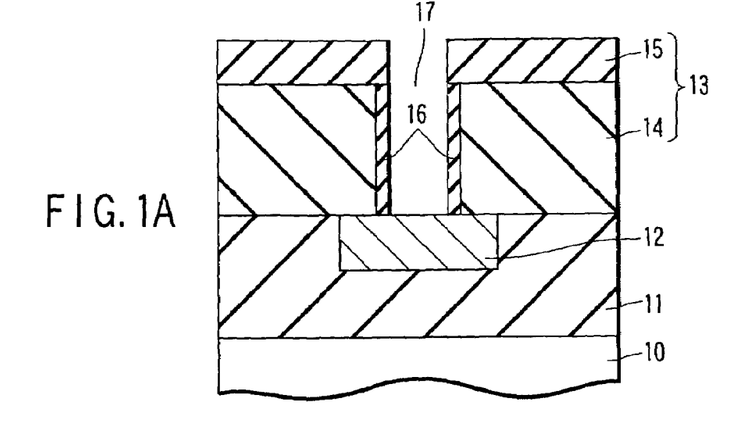
FIG. 1A is a sectional view of a semiconductor device in one step of a method of manufacturing a semiconductor device according to a first embodiment of the invention, particularly in a step of forming via holes (or wiring grooves) in a multilayer wiring section.
Figure 1B:
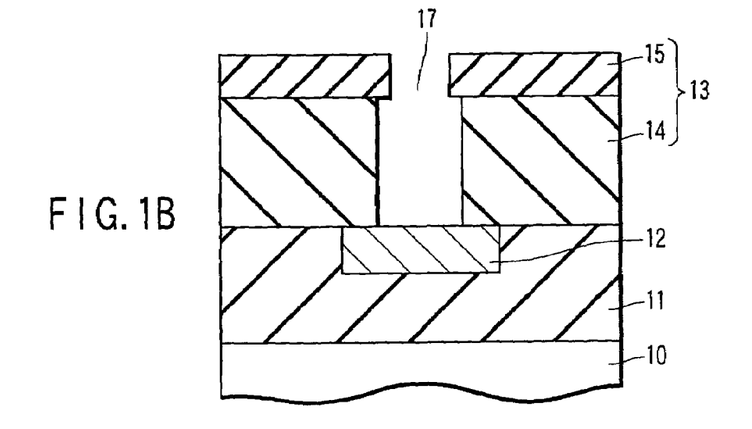
FIG. 1B is a sectional view of a semiconductor device in a further step of the method of manufacturing the semiconductor device according to the first embodiment of the invention.
Figure 1C:
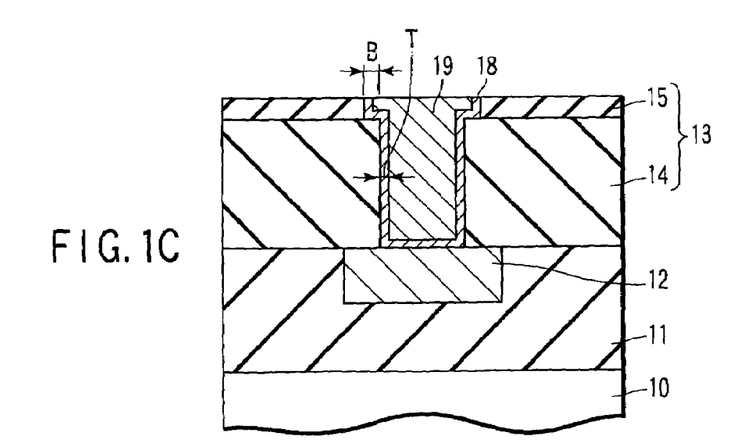
FIG. 1C is a sectional view of a semiconductor device in a further step of the method of manufacturing the semiconductor device according to the first embodiment of the invention.

FIGS. 1A to 1C are sectional views of a semiconductor device in steps of a method of manufacturing a semiconductor device according to a first embodiment of the invention, particularly in a step of forming via holes (or wiring grooves) in a multilayer wiring section.

As shown in FIG. 1A, a metal wiring (lower layer wiring) 12 is buried in a first interlayer insulating film 11 formed on a semiconductor substrate 10, and a second interlayer insulating film 13 is formed on the lower layer wiring 12 and first interlayer insulating film 11. The second interlayer insulating film 13 has a laminated structure composed of a first insulating film 14 and a second insulating film 15. The first insulating film 14 is formed on the lower layer wiring 12 and first interlayer insulating film 11, and the second insulating film 15 is laminated on the first insulating film 14.

The first insulating film 14 is formed of a silicon oxide film (hereinafter, referred to as $SiO_2$ film) containing carbon. The second insulating film 15 is of a low carbon concentration (or no carbon) and functions as a cap film. The first insulating film 14 is formed of such as methyl siloxane, SiOCH, or SiOC, and the second insulating film 15 is formed of, for example, $SiO_2$, or SiOCH which is low in carbon concentration.

Subsequently, a resist pattern (not shown) is formed on the second insulating film 15 by means of lithography, and a via hole 17 is formed in the second interlayer insulating film 13, as shown in FIG. 1A, by performing an RIE process, using the resist pattern as an etching mask. Then, the resist pattern is removed by ashing.

Due to the RIE process and ashing process being performed, the concentration of the contained carbon is lowered in the side surface of the first insulating film 14 defining the via holes, and a damaged layer 106 of a lowered carbon concentration is formed.

A surface layer of a via hole side surface of the first insulating film 14 and a surface layer of a via hole side surface of the second insulating film 15 are dissolved by wet etching using a chemical solution containing HF, $NHF_3$ or the like, and removed as shown in FIG. 1B. At this time, when the wet etching process is conducted for a predetermined period of time or more, the opening diameter in the second insulating film 15 is larger than that in the first insulating film 14 at an interface between the first insulating film 14 and the second insulating film, 15 as shown in FIG. 1C.

The relation of the opening diameter between the first insulating film 14 and the second insulating film 15 at the interface therebetween is explained by referring to an example in which a process of defining the relation of the opening diameter in the first insulating film<the opening diameter in the second insulating film is performed.

Since the damaged layer 16 formed at the side surface of the via hole 17 in the first insulating film 14 is lower in the carbon concentration, and it is a film damaged by oxidation, it is dissolved in acid such as HF or $NHF_3$ and removed at the time of wet etching. The etching rate of the damaged film 16 at this time is greater than that of the second insulating film 15, and the shape of the via hole 17 becomes as shown in FIG. 1B.

Since the damaged layer 16 is removed, the side surface of the first insulating film 14 is exposed to the side surface of the via hole. Since this exposed side surface is substantially free from effects of RIE or resist ashing process in the forming process of the damaged layer 16, its carbon concentration is maintained nearly in the state before the process. Accordingly, the first insulating film 14 exposed to the via hole side surface is extremely low in the etching rate by HF, $NHF_3$ or the like. On the other hand, the second insulating film 15 of relatively low carbon concentration is intermediate in the etching rate by FN, NHF3 or the like between the damaged layer 16 and first insulating layer 14.

Therefore, after the damaged layer 16 is dissolved, the second insulating film 15 is etched faster than the first insulating layer 14. By properly selecting this etching time, as shown in FIG. 1C, the relation of the opening diameter between the first insulating film 14 and the second insulating film 15 at the interface therebetween may be defined in the relation of the opening diameter in the first insulating film<the opening diameter in the second insulating film.

That is, since the opening edge of the second insulating film 15 retreats from the axis of the via hole 17 more than the opening edge of the first insulating layer 14, then disconnections of the barrier metal layer 18 can be prevented in a subsequent step of forming a barrier metal film 18. Also, in a subsequent step of forming a via contact 19 by burying a metal material (Cu or Cu alloy) in the via hole 17, insufficient embedding of the metal material (Cu or Cu alloy) in the via hole is prevented, so that the reliability of the wiring is enhanced.

Figure 2:
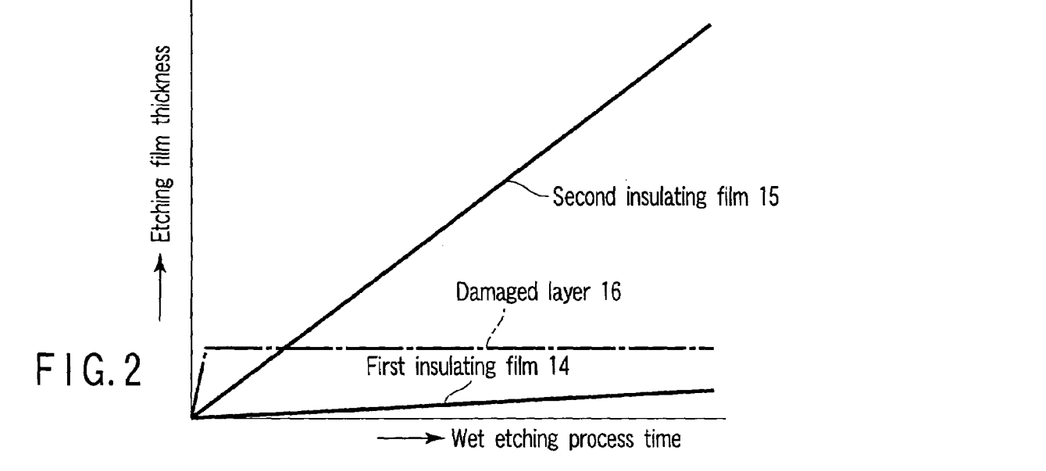
FIG. 2 is a characteristic diagram showing measurement data of etching speed of a damaged layer, a first insulating film, and a second insulating film in HF solution in the wet etching process shown in FIG. 1.

FIG. 2 is a characteristic diagram based on measurement data of etching rate of the damaged layer 16, second insulating film 15, and first insulating film 14 in, for example, HF solution in the wet etching process executed in the step shown in FIGS. 1B and 1C. Herein, the HF solution contains $H_2O$ and HF at a ratio of, for example, 100:1 by vol. %. On the basis of this characteristic diagram, the retreat amount B of the second insulating film 15 at the interface between the first insulating film 14 and the second insulating film 15 may be determined.

<Modified Examples of First Embodiment>

Modified examples of sectional shapes of via holes (or wiring grooves) are described hereinafter, in which the relation between the opening diameter in the first insulating film 14 and the opening diameter in the second insulating film 15 at the interface therebetween is defined to be a relation of the opening diameter in the first insulating film<the opening diameter in the second insulating film, as described in the first embodiment.

Figure 3:
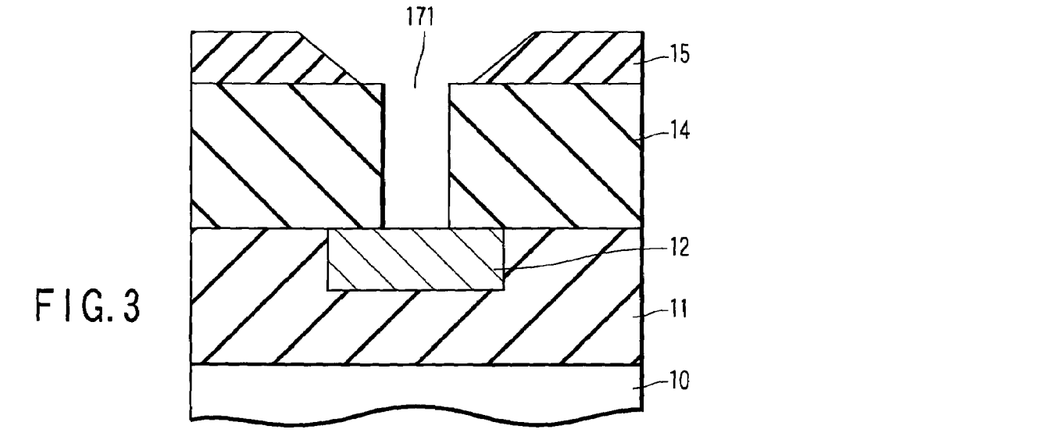
FIG. 3 is a sectional view showing modified example 1 of the semiconductor device shown in FIG. 1C.

FIG. 3 is a sectional view of a multilayer wiring structure according to modified example 1 of the first embodiment.

A via hole (or wiring groove) 171 shown in FIG. 3 is different from that shown in FIG. 1C in that the side surface of the second insulating film 15 for defining the via hole is tapered. That is, the side surface of the second insulating film 15 for defining the via hole is tapered in a manner that the opening diameter in the second insulating film 15 is greater as the position on the opening is more away from the interface between the first insulating film 14 and the second insulating film 15. Other parts or portions are the same as those used in FIG. 1C, and thus identified with same reference numerals as those used in FIG. 1C.

The second insulating film 15 is processed in various shapes depending on the processing conditions. In the structure in FIG. 3, the relation of the opening diameter at the interface between the first insulating film 14 and the second insulating film 15 is defined such that the opening diameter in the first insulating film<the opening diameter in the second insulating film is obtained. Therefore, the same effects as in the first embodiment are obtained.

Figure 4:
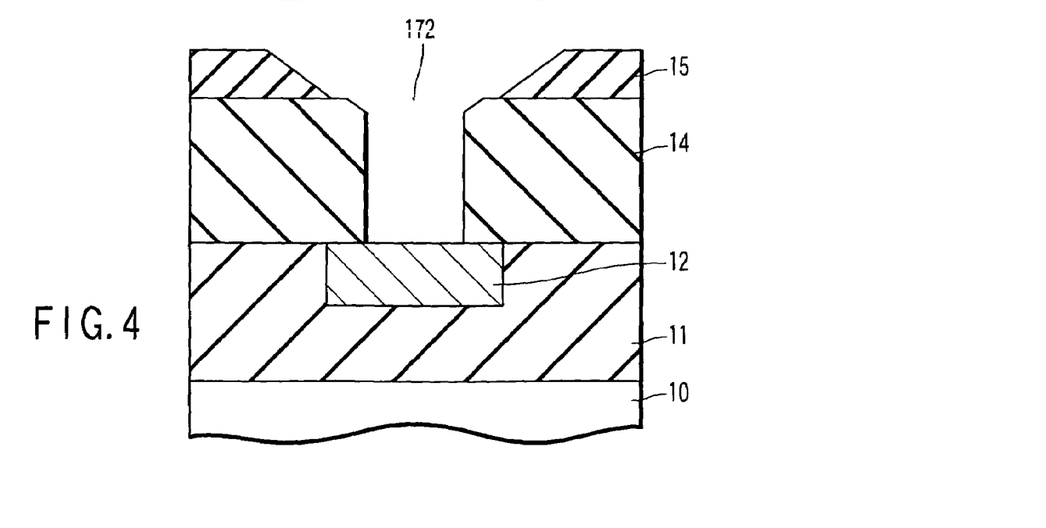
FIG. 4 is a sectional view showing modified example 2 of the semiconductor device shown in FIG. 1C.

FIG. 4 is a sectional view showing a part of a multilayer wiring structure according to modified example 2 of the first embodiment.

A via hole (or wiring groove) 172 in FIG. 4 is different from that shown in FIG. 3 in that the opening edge section of the first insulating film 14 (the shoulder of the opening edge of the first insulating film 14) is tapered. That is, the opening edge section of the first insulating film 14 (the shoulder of the opening edge of the first insulating film 14) is tapered by RIE or the like such that the opening diameter of the opening edge section of the first insulating film 14 is greater as the position on the opening is closer to the interface between the first insulating film 14 and the second insulating film 15. Other parts or portions are the same as those used in FIG. 3, and thus identified with same reference numerals as those used in FIG. 3.

In the structure in FIG. 4, the relation of the opening diameter at the interface between the first insulating film 14 and the second insulating film 15 is defined such that the opening diameter in the first insulating film<the opening diameter in the second insulating film is obtained, and therefore the same effects as in the first embodiment are obtained.

Figure 5:
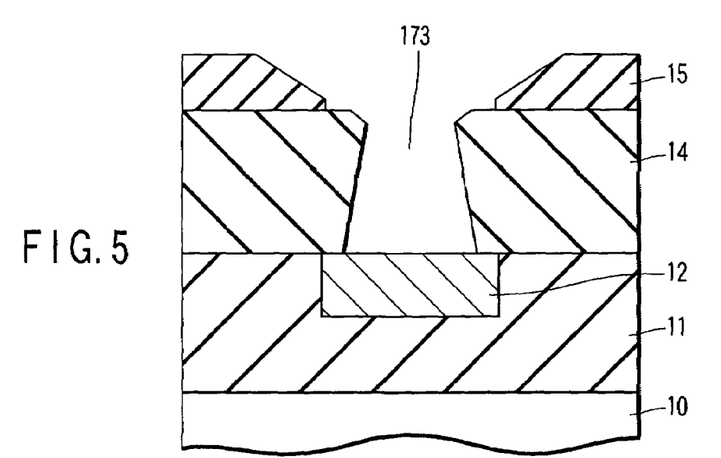
FIG. 5 is a sectional view showing modified example 3 of the semiconductor device shown in FIG. 1C.

FIG. 5 is a sectional view showing a part of a multilayer wiring structure according to modified example 3 of the first embodiment.

A via hole (or wiring groove) 173 in FIG. 5 is different from that shown in FIG. 4 in that the via hole side surface of the first insulating film 14 is reverse-tapered. That is, the via hole side surface of the first insulating film 14 is reverse-tapered such that the opening diameter in the first insulating film 14 is smaller toward the interface between the first insulating film 14 and the second insulating film 15. Other parts or portions are the same as those used in FIG. 4, and thus identified with same reference numerals as those used in FIG. 4.

In the structure in FIG. 5, the relation of the opening diameter at the interface between the first insulating film 14 and the second insulating film 15 is defined such that the opening diameter in the first insulating film<the opening diameter in the second insulating film is obtained, and therefore the same effects as those in the first embodiment are obtained. However, since in the present embodiment the via hole side surface of the first insulating film 14 is reversely tapered, then the embedding characteristic of the metal wiring material (Cu, etc.) is degraded as compared with other examples.

As in modified example 2 shown in FIG. 4 of the first embodiment, when the opening edge of the first insulating film 14 is tapered by RIE or the like, the metal wiring material will be easily embedded.

Figure 6:
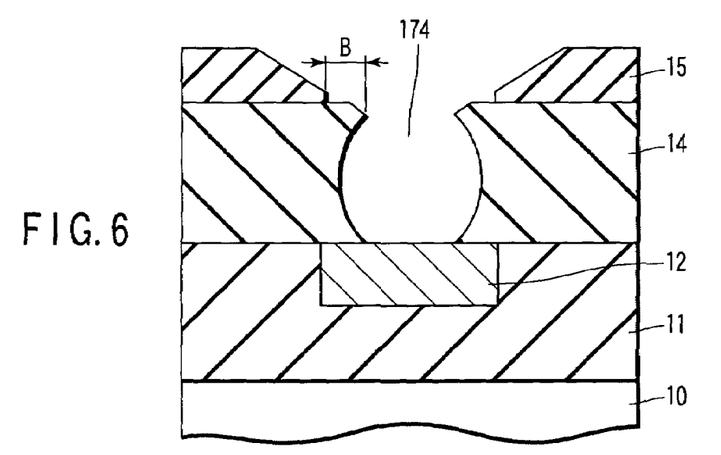
FIG. 6 is a sectional view showing modified example 4 of the semiconductor device shown in FIG. 1C.

FIG. 6 is a sectional view showing a part of a multilayer wiring structure according to modified example 4 of the first embodiment.

A via hole (or wiring groove) 174 in FIG. 6 is different from that shown in FIG. 4 in that the via hole side surface of the first insulating film 14 is processed into a barrel shape (bowing shape) like, for example, a beer barrel, and the shoulder portion of the opening edge of the first insulating film 14 is cut off, and others are the same as those in FIG. 4, and thus identified with the same reference numerals as those in FIG. 4.

In the structure in FIG. 6, the relation of the opening diameter at the interface between the first insulating film 14 and the second insulating film 15 is defined such that the opening diameter in the first insulating film<the opening diameter in the second insulating film is obtained, and therefore the same effects as those in the first embodiment are obtained. In this case, as in modified example 2 of the first embodiment shown in FIG. 4, when the opening edge of the first insulating film 14 is tapered by RIE or the like, embedding of the metal wiring material will be easier.

Other modified examples of the first embodiment will also be realized. In the first embodiment, for the simplicity of explanation, the sectional shape of the via hole is shown, however, the invention may be also applied in the case of forming the structure of a via hole contacting a part of the bottom of the wiring grooves by dual damascene (DD) process.

<Second Embodiment>

Figure 7:
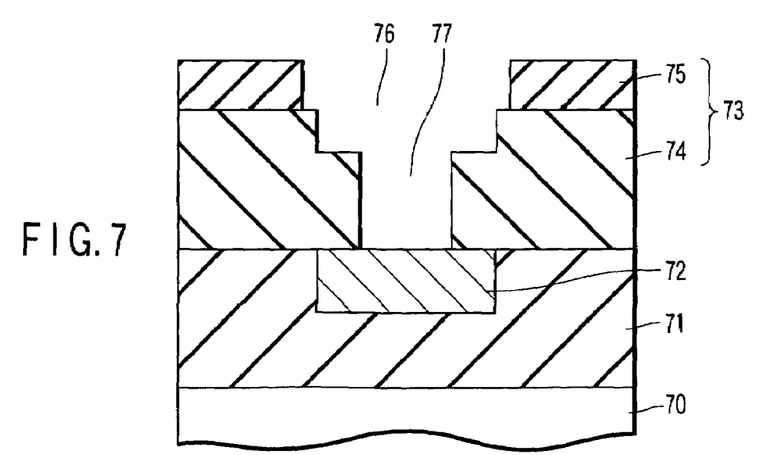
FIG. 7 is a sectional view of a semiconductor device in one step of a method of manufacturing a semiconductor device according to a second embodiment of the invention, particularly in a step of forming via holes (or wiring grooves) in a multilayer wiring section.

FIG. 7 is a sectional view showing a part of a multilayer wiring structure, in which a wiring groove and a via hole are formed, of a semiconductor device according to a second embodiment of the present invention.

The structure shown in FIG. 7 is similar to the first embodiment, that is, a lower layer wiring 72 is buried in a first insulating film 71 on a semiconductor substrate 70, and an interlayer insulating film 73 is formed on the lower layer wiring 72 and first insulating film 71. The interlayer insulating film 73 is comprised of a first insulating film 74 formed on the lower layer wiring 72 and first insulating film 71 and a second insulating film 75 laminated on the first insulating film 74.

In the dual damascene (DD) method, a wiring groove 76 and a via hole 77 are formed by using RIE process. The wiring groove 76 reaches in a depth the inside of the first insulating film 74 by way of the insulating film 75, and the via hole 77 reaches the lower layer wiring 72 from part of the bottom of the wiring groove 76 in the first insulating film 74. The damaged layer (not shown) formed, due to the RIE process, at the side surface of the first insulating film 74 for defining the wiring groove 76 and via hole 77 is dissolved later in the wet etching process by using chemical solution containing HF, $NHF_3$ or the like.

By performing this wet etching process for a predetermined period of time or more, as in the first embodiment, the relation of the opening diameter at the interface between the first insulating film 74 and the second insulating film 75 is defined such that the opening diameter in the first insulating film<the opening diameter in the second insulating film is obtained. Therefore, it is effective to prevent protrusion of the opening edge of the second insulating film 75 in the opening of the first insulating film 74. Thereafter, a barrier metal layer (not shown) is formed in the inside of the via hole 77 and wiring groove 76, and further a metal wiring material is buried, thereby forming via (not shown) and metal wiring (not shown).

In the structure shown in FIG. 7, since the relation of the opening diameter at the interface between the first insulating film 74 and the second insulating film 75 is defined such that the opening diameter in the first insulating film<the opening diameter in the second insulating film is obtained, the same effects as those in the first embodiment are obtained.

Figure 8:
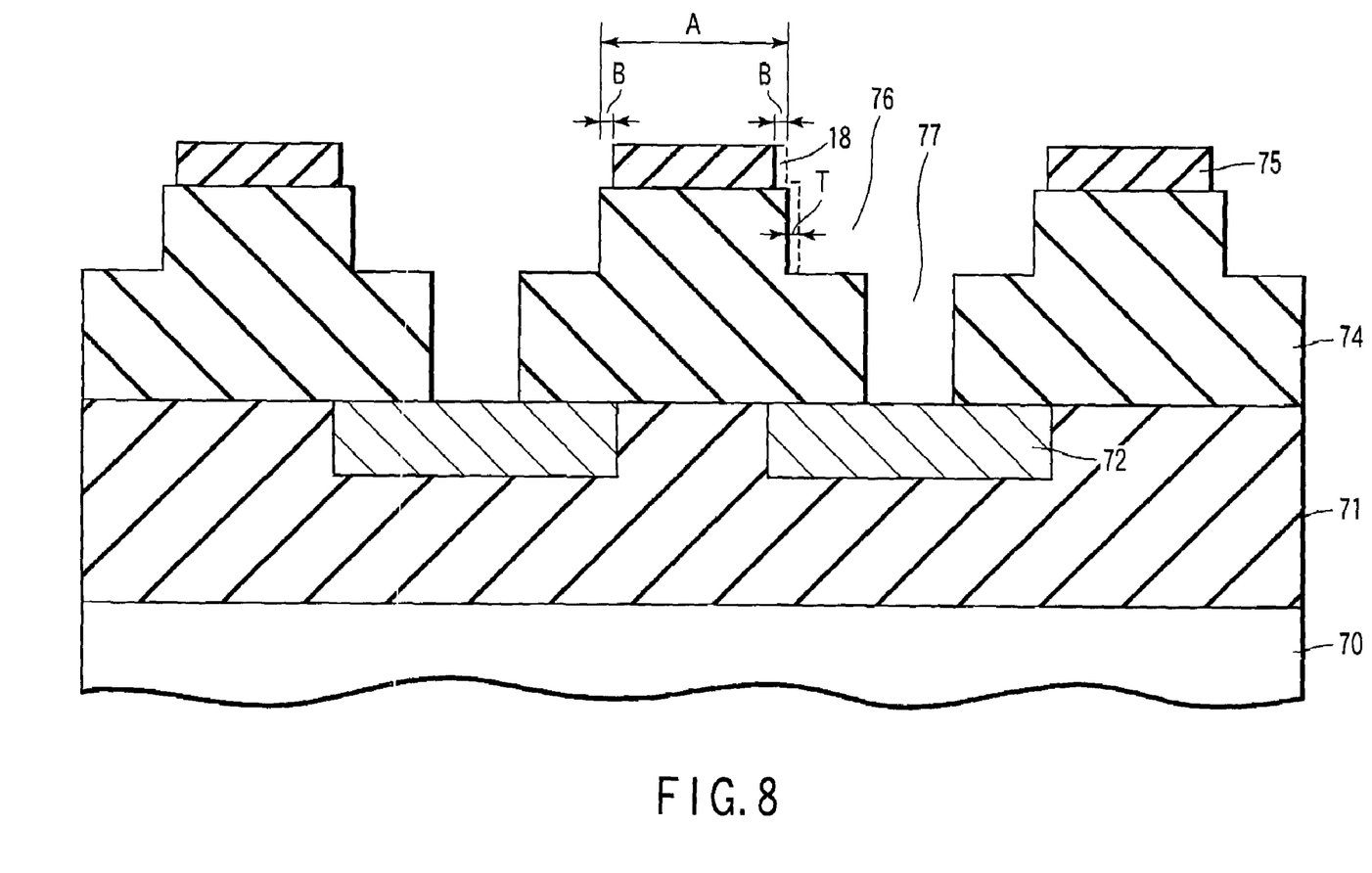
FIG. 8 is a sectional view showing the structure of FIG. 7 in an array state, for explaining the condition of retreat amount B of a second insulating film 75.

FIG. 8 is a sectional view for explaining the condition of retreat amount B of the second insulating film in the repeated array shown in FIG. 7.

When two or more patterns of upper layer metal wiring are arranged, the retreat amount B of the second insulating layer 75 at the interface between the insulating film 74 and the second insulating film 75 should be properly defined at B<0.25 A, where A is a space between adjacent upper layer wirings (width of first insulating layer 74). In other words, it is appropriate to set the difference to A/2 or less, which is between the width A of the first insulating film 74 and the width of the second insulating film 75 at the interface therebetween.

To distinguish the retreat by this setting of the second insulating film 75 from the retreat of the second insulating film 75 by the process variation, the retreat amount B may be set to be equal to or more than (B≧T) the film thickness T of a barrier metal film 78 deposited inside of the groove when the metal wiring is formed. In other words, the difference between the width A of the first insulating layer 74 and the width of the second insulating film 75 at the interface therebetween may be set to two times or more than the film thickness T of the barrier metal film.

Similarly, in the foregoing first embodiment and its modified examples, if the retreat amount B of the second insulating film 15 is set to be equal to or more than the film thickness T of the barrier metal 18 deposited when the via contact 19 is formed, then it is possible to distinguish the retreat of the second insulating film 15 by the setting from the retreat of the second insulating film 15 by the process variation.

<Modified Example of First Embodiment>

Figure 9:
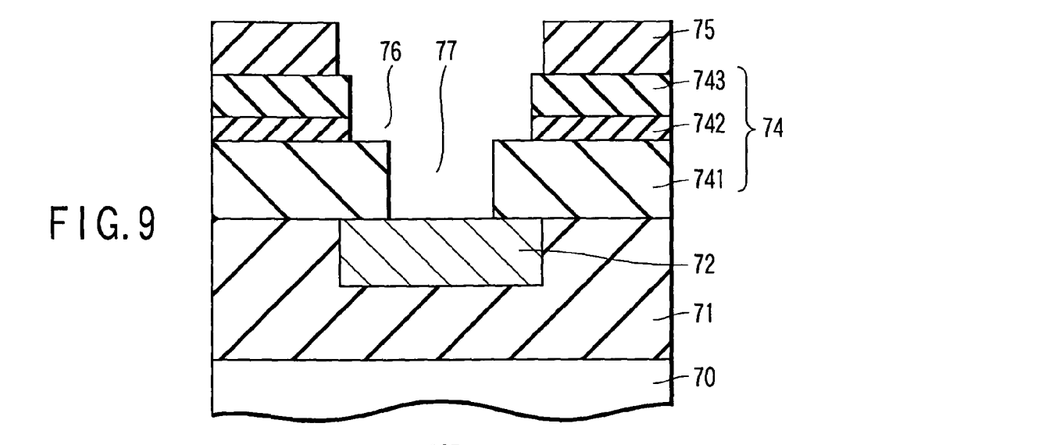
FIG. 9 is a sectional view showing modified example 1 of the semiconductor device shown in FIG. 7.

FIG. 9 is a sectional view showing a part of a multilayer wiring structure according to modified example 1 of the second embodiment.

In the second embodiment shown in FIG. 7, the wiring groove 76 and via hole 77 are formed in the first insulating film 74. The first insulating film 74 may be formed in a multilayer structure, and its example is explained below.

The structure shown in FIG. 9 is different from that shown in FIG. 7 in that the first insulating film 74 has a three-layer structure, and the via hole 77 is formed in an insulating film 741 of the bottom layer, and the wiring groove 76 is formed in an insulating film 742 of the intermediate layer and an insulating film 743 of the uppermost layer. Other parts or portions are the same as those used in FIG. 7, and thus identified with same reference numerals as those used in FIG. 7.

In this case, a film of SiOC series is used in the insulating film 743 of the uppermost layer in the first insulating film 74, and the second insulating layer 75 of a carbon concentration lower than that of the insulating film 743 is deposited on the insulating film 743. The relation of the opening diameter at the interface between the SiOC series insulating film 743 and the second insulating film 75 is defined such that the opening diameter in the series insulating film<the opening diameter in the second insulating film. Meanwhile, since the insulating film 742 of the intermediate layer and the insulating film 741 of the bottom layer of the first insulating film 74 are remote from the second insulating film 75, and hence the film quality is not particularly specified.

Also in the second embodiment, as the via hole in the modified examples of the first embodiment, the sectional shape of the wiring groove may be modified in various shapes.

In these embodiments, the Si oxide film containing carbon is used as the first insulating films 14, 74, but it is also possible to use organic films (for example, CF film, or CN(H) film) containing carbon and containing no Si.

According to the semiconductor device and the method of manufacturing the same according to the embodiments, protrusions are not formed in the opening of the wiring groove or via hole formed in the interlayer insulating film, so that thin portions and disconnections are not formed in the barrier metal film deposited when buried wiring is formed in the wiring groove or a via contact is formed in the via hole. Therefore, embedding of wiring material metal is enhanced, and also electromigration and stress migration of buried wiring and via portions may be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an interlayer insulating film formed on the semiconductor substrate, the interlayer insulating film comprising a first insulating film formed on the semiconductor substrate and a second insulating film formed on the first insulating film, the first insulating film containing carbon of a concentration, the second insulating film containing carbon of a concentration lower than the concentration of the first insulating film or containing substantially no carbon,
   wherein a metal wiring of a metal material is embedded in a wiring groove formed in the interlayer insulating film, a width of the wiring groove in the first insulating film is smaller than that in the second insulating film at an interface between the first insulating film and the second insulating film, and
   the width of the wiring groove in the first insulating film is substantially constant, and the width of the wiring groove in the second insulating film is substantially constant.

2. The semiconductor device according to claim 1, in which two or more of the metal wirings are provided in a side-by-side arrangement, and, when A denotes a width of the first insulating film between adjacent metal wirings, at the interface between the first insulating film and the second insulating film, in a direction of the side-by-side arrangement of the metal wirings, a difference in width between the first insulating layer and the second insulating fun is A/2 or less.

3. The semiconductor device according to claim 1, in which the metal wiring is provided in the wiring groove, with an interlaid barrier metal, and
   a difference in width between the first insulating film and the second insulating film, at the interface between the first insulating film and the second insulating film, is 2 T or more, where T denotes a film thickness of the interlaid baffler metal.

4. The semiconductor device according to claim 1, in which the first insulating film is made of methyl siloxane, SiOCH, SiOC, CF, or CN(H), and the second insulating film is made of $SiO_2$ or SiOCH, and low in carbon concentration.

5. The semiconductor device according to claim 1, in which the metal wiring is made of Cu or Cu alloy.

6. The semiconductor device according to claim 1, in which the first insulating film includes a silicon oxide film.

7. A semiconductor device comprising:
   a semiconductor substrate;
   a first interlayer insulating layer formed on the semiconductor substrate, and having a first wiring formed on a surface of the first interlayer insulating layer;
   a second interlayer insulating layer formed on the first interlayer insulating layer, and comprising a first insulating film and a second insulating film formed on the first insulating film, the first insulating film containing carbon of a concentration, the second insulating film containing carbon of a concentration lower than the concentration of the first insulating film or containing substantially no carbon; and a via contact embedded in a via hole which extends through the first interlayer insulating layer and at least a portion of which is formed on the first wiring, and a second wiring embedded in a wiring groove which extends through the second and first insulating films;

wherein a width of the second wiring groove in the first insulating film is smaller than that in the second insulating film at an interface between the first insulating film and the second insulating film, the width of the second wiring groove in the first insulating film is substantially constant, and the width of the wiring groove in the second insulating film is substantially constant.

8. The semiconductor device according to claim 7, in which two or more of the second wirings are provided in a side-by-side arrangement, and, when A denotes a width of the first insulating film between adjacent second wirings, at the interface between the first insulating film and the second insulating film, in a direction of the side-by-side arrangement of the second wirings, a difference in width between the first insulating layer and the second insulating film, is A/2 or less.

9. The semiconductor device according to claim 7, in which the second wiring is embedded in the wiring groove with an interlaid barrier metal, and the via contact is embedded in the via hole with an interlaid barrier metal; and a difference in width between the first insulating film and the second insulating film, at the interface between the first insulating film and the second insulating film, is 2 T or more, where T denotes a film thickness of each of the interlaid barrier metals.

10. The semiconductor device according to claim 7, in which the first insulating film is made of methyl siloxane, SiOCH, SiOC, CF, or CN(H), and the second insulating film is made of $SiO_2$ or SiOCH, and low in carbon concentration.

11. The semiconductor device according to claim 7, in which the second wiring and the via contact are made of Cu or Cu alloy.

12. The semiconductor device according to claim 7, in which the first insulating film includes a silicon oxide film.

* * * * *